United States Patent
Chen et al.

(10) Patent No.: US 9,853,767 B2
(45) Date of Patent: Dec. 26, 2017

(54) METHOD AND APPARATUS FOR DETERMINING NONLINEAR CHARACTERISTIC AND SYSTEM

(71) Applicant: FUJITSU LIMITED, Kawasaki (JP)

(72) Inventors: Hao Chen, Beijing (CN); Zhenning Tao, Beijing (CN)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/265,360

(22) Filed: Sep. 14, 2016

(65) Prior Publication Data
US 2017/0078046 A1   Mar. 16, 2017

(30) Foreign Application Priority Data
Sep. 15, 2015   (CN) .......................... 2015 1 0586807

(51) Int. Cl.
G06F 17/50   (2006.01)
H04L 1/00    (2006.01)
H04L 25/03   (2006.01)
H04L 5/00    (2006.01)

(52) U.S. Cl.
CPC ............ *H04L 1/0017* (2013.01); *H04L 5/006* (2013.01); *H04L 25/03993* (2013.01)

(58) Field of Classification Search
CPC .. H04L 1/0017; H04L 25/03993; H04L 5/006
See application file for complete search history.

(56) References Cited

U.S. PATENT DOCUMENTS

| | | | |
|---|---|---|---|
| 2002/0123869 A1* | 9/2002 | Koppl | G01R 31/2848 |
| | | | 703/4 |
| 2007/0136018 A1* | 6/2007 | Fernandez | G01R 31/3191 |
| | | | 702/86 |
| 2013/0166259 A1* | 6/2013 | Weber | G06F 17/5009 |
| | | | 703/2 |

(Continued)

FOREIGN PATENT DOCUMENTS

CN   103297155 A   9/2013

OTHER PUBLICATIONS

Morgan et al., "A Generalized Memory Polynomial Model for Digital Predistortion of RF Power Amplifiers" IEEE Transactions on Signal Processing, vol. 54, No. 10, Oct. 2006, pp. 3852-3860.

*Primary Examiner* — Dac Ha
(74) *Attorney, Agent, or Firm* — Staas & Halsey LLP

(57) ABSTRACT

Embodiments of the present disclosure provide a method and apparatus for determining a nonlinear characteristic and a system. The method for determining a nonlinear characteristic includes: determining a correction factor of a nonlinear item of a nonlinear model of a system to be measured according to an input and/or a parameter of the system to be measured; correcting the nonlinear item of a nonlinear model of the system to be measured by using the correction factor; and obtaining a nonlinear characteristic of the system to be measured according to the corrected nonlinear model. The nonlinear characteristic allows the input and/or the parameter of the system to be corrected to produce a corrected output. With the embodiments of the present disclosure, the nonlinear characteristic of the system to be measured under different inputs and/or parameters may be estimated, and accuracy of the estimation and applicability are improved.

20 Claims, 6 Drawing Sheets

02 the correction factor is determined according to the signal power by using an empirical formula of a correction factor and signal power

(56) References Cited

U.S. PATENT DOCUMENTS

| | | | |
|---|---|---|---|
| 2013/0226489 A1 | 8/2013 | Sogl et al. | |
| 2013/0346039 A1* | 12/2013 | Song | G05B 13/04 703/2 |
| 2015/0249889 A1* | 9/2015 | Iyer | H04R 3/08 381/98 |

* cited by examiner

METHOD AND APPARATUS FOR DETERMINING NONLINEAR CHARACTERISTIC AND SYSTEM

CROSS-REFERENCE TO RELATED APPLICATIONS

This application claims the priority benefit of Chinese Patent Application No. 201510586807.2 filed on Sep. 15, 2015 in the Chinese State Intellectual Property Office, the disclosure of which is incorporated herein in its entirety by reference.

BACKGROUND

1. Field

The present disclosure relates to the field of communications, and in particular to a method and apparatus for determining a nonlinear characteristic and a system.

2. Description of the Related Art

As continuous increase of a transmission rate of a communication system, much attention is paid to a nonlinear characteristic in the system as it has become one of limiting factors of performance. Among various methods dealing with the nonlinear characteristic in the system, a necessary step is measuring and estimating the nonlinear characteristic so that it can be corrected.

Currently, there are two common methods for measuring and estimating the nonlinear characteristic. One is comparing directly input and output time domain waveforms to obtain an input output transfer function (Document 1), with an advantage of being convenient and direct, and a disadvantage of being large in error for a large bandwidth system, nonlinearity may be under-estimated, and resulting in failure of system transmission. The other one is modeling the nonlinearity of the system first, and then training a model coefficient using a training sequence or an iteration method (Document 2), with an advantage of being more accurate than the first method, and a disadvantage of being complex in the measurement apparatuses and processes, and being hard to meet requirements of a high-speed communication system on hardware and time efficiency.

FIG. 1A is a schematic diagram of a system to be measured with fixed parameters, and FIG. 1B a schematic diagram of a Volterra nonlinear model (referred to as a Volterra model) corresponding to the system to be measured of FIG. 1A. As shown in FIGS. 1A and 1B, in FIG. 1B, $$y(n) = \sum_{K=-(N_1-1)/2}^{(N_1-1)/2} h_k^{(1)} x(n-k) + \sum_{k=-(N_2-1)/2}^{(N_2-1)/2} \sum_{l=-(N_2-1)/2}^{(N_2-1)/2} h_{k,l}^{(2)} x(n-k) x(n-l) +$$

$$\sum_{k=-(N_3-1)/2}^{(N_3-1)/2} \sum_{l=-(N_3-1)/2}^{(N_3-1)/2} \sum_{m=-(N_3-1)/2}^{(N_3-1)/2} h_{k,l,m}^{(3)} x(n-k) x(n-l) x(n-m) + \dots ;$$

where, $$\sum_{K=-(N_1-1)/2}^{(N_1-1)/2} h_k^{(1)} x(n-k)$$

is a first-order item, $N_1$ is a memory length, and $h_k^{(1)}$ is a coefficient;

$$\sum_{k=-(N_2-1)/2}^{(N_2-1)/2} \sum_{l=-(N_2-1)/2}^{(N_2-1)/2} h_{k,l}^{(2)} x(n-k) x(n-l)$$

is a second-order item, $N_2$ is a memory length, and $h_{k,l}^{(2)}$ is a coefficient;

$$\sum_{k=-(N_3-1)/2}^{(N_3-1)/2} \sum_{l=-(N_3-1)/2}^{(N_3-1)/2} \sum_{m=-(N_3-1)/2}^{(N_3-1)/2} h_{k,l,m}^{(3)} x(n-k) x(n-l) x(n-m)$$

is a third-order item, $N_3$ is a memory length, and $h_{k,l,m}^{(3)}$ is a coefficient;

n denotes time coordinates of a signal x( ), x(n) is a value of the signal at an n-th moment, x(n+1) is a value of the signal at an (n+1)-th moment, and x(n−k) is a value of the signal at an (n−k)-th moment; and k, l and m denote memory lengths, which are offsets relative to the moment n, for example, x(n) which is offset by a memory length k becomes x(n−k);

and so on.

Due to such advantages as the items are complete, the assumptions are few, and accuracy is good, etc., the Volterra model is applicable to estimation of a nonlinear characteristic of a long memory effect of a high-speed large bandwidth.

Document 1: CN103297155A; and

Document 2: Dennis R. Morgan, etc, 'A Generalized Memory Polynomial Model for Digital Predistortion of RF Power Amplifiers', IEEE Transactions on Signal Processing, vol. 54, no. 10, 2006.

It should be noted that the above description of the background is merely provided for clear and complete explanation of the present disclosure and for easy understanding by those skilled in the art. And it should not be understood that the above technical solution is known to those skilled in the art as it is described in the background of the present disclosure.

SUMMARY

Additional aspects and/or advantages will be set forth in part in the description which follows and, in part, will be apparent from the description, or may be learned by practice of the embodiments.

In a high-speed communication system, since there exist such functions as adaptive control, feedback control, a dynamic control, etc., system parameters, such as an amplifier gain, must be adjustable, and adjustment of the system parameters will result in a change of a nonlinear characteristic. However, an existing Volterra model and measurement method are only applicable to nonlinear estimation of a system to be measured with fixed parameters. Hence, the existing Volterra model is unable to reflect such change of the nonlinear characteristic. In order to solve such a problem, an existing technology is to perform multiple times of measurement for different system parameters, so as to perform estimation of the nonlinear characteristic, with a disadvantage that the multiple times of measurement are often accompanied by extra temporal complexity and spatial complexity, and the efficiency of the system is low.

In order to solve the above problems, embodiments of the present disclosure provide a method and apparatus for determining a nonlinear characteristic and a system.

According to a first aspect of the embodiments of the present disclosure, there is provided an apparatus for determining a nonlinear characteristic, including:

- a first determining unit configured to determine a correction factor of a nonlinear item of a nonlinear model of a system to be measured according to an input and/or a parameter of the system to be measured;
- a correcting unit configured to correct the nonlinear item of the nonlinear model of the system to be measured by using the correction factor; and
- a second determining unit configured to obtain a nonlinear characteristic of the system to be measured according to the corrected nonlinear model.

The nonlinear characteristic allows the input and/or the parameter of the system to be corrected to produce a corrected output.

According to a second aspect of the embodiments of the present disclosure, there is provided a method for determining a nonlinear characteristic, including:

- determining a correction factor of a nonlinear item of a nonlinear model of a system to be measured according to an input and/or a parameter of the system to be measured;
- correcting the nonlinear item of the nonlinear model of the system to be measured by using the correction factor; and
- obtaining a nonlinear characteristic of the system to be measured according to the corrected nonlinear model.

According to a third aspect of the embodiments of the present disclosure, there is provided a network entity, including the apparatus as described in the first aspect.

According to a fourth aspect of the embodiments of the present disclosure, there is provided a communication system, including the network entity as described in the third aspect.

An advantage of the embodiments of the present disclosure exists in that with the embodiments of the present disclosure, the nonlinear characteristic of the system to be measured under different inputs and/or parameters may be estimated, and accuracy of the estimation and applicability are improved.

With reference to the following description and drawings, the particular embodiments of the present disclosure are disclosed in detail, and the principle of the present disclosure and the manners of use are indicated. It should be understood that the scope of the embodiments of the present disclosure is not limited thereto. The embodiments of the present disclosure contain many alternations, modifications and equivalents within the scope of the terms of the appended claims.

Features that are described and/or illustrated with respect to one embodiment may be used in the same way or in a similar way in one or more other embodiments and/or in combination with or instead of the features of the other embodiments.

It should be emphasized that the term "comprises/comprising/include/including" when used in this specification is taken to specify the presence of stated features, integers, steps or components but does not preclude the presence or addition of one or more other features, integers, steps, components or groups thereof.

BRIEF DESCRIPTION OF THE DRAWINGS

The drawings are included to provide further understanding of the present disclosure, which constitute a part of the specification and illustrate the preferred embodiments of the present disclosure, and are used for setting forth the principles of the present disclosure together with the description. It is obvious that the accompanying drawings in the following description are some embodiments of the present disclosure only, and a person of ordinary skill in the art may obtain other accompanying drawings according to these accompanying drawings without making an inventive effort. In the drawings.

DETAILED DESCRIPTION

These and further aspects and features of the present disclosure will be apparent with reference to the following description and attached drawings. In the description and drawings, particular embodiments of the disclosure have been disclosed in detail as being indicative of some of the ways in which the principles of the disclosure may be employed, but it is understood that the disclosure is not limited correspondingly in scope. Rather, the disclosure includes all changes, modifications and equivalents coming within the terms of the appended claims.

Embodiment of the present disclosure provides a method and apparatus for determining a nonlinear characteristic and a system, in which nonlinear items of the Volterra model are corrected, and the corrected model is used to estimate the nonlinear characteristic of the system to be measured under different inputs and/or parameter configuration.

The embodiment of the present disclosure shall be described below with reference to the accompanying drawings and particular implementations.

Embodiment 1

Figure 1A:
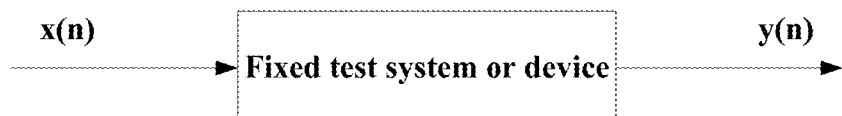
FIG. 1A is a schematic diagram of a system to be measured with fixed parameters.
Figure 1B:
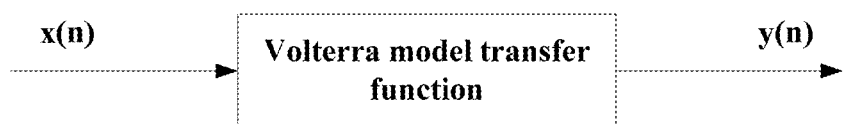
FIG. 1B a schematic diagram of principles of a Volterra nonlinear model corresponding to the system to be measured in FIG. 1A.
Figure 2:
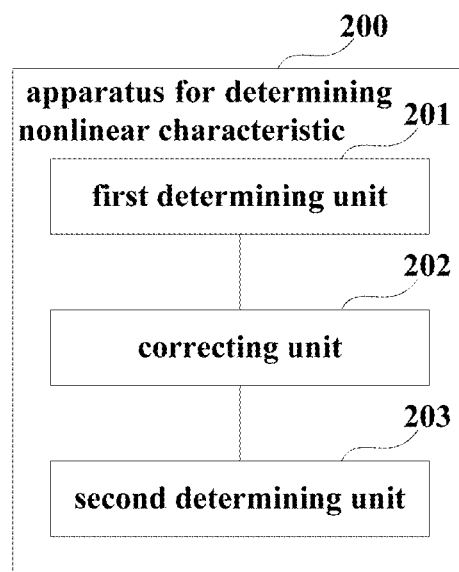
FIG. 2 is a schematic diagram of a structure of the apparatus for determining a nonlinear characteristic of an embodiment of the present disclosure.

An embodiment of the present disclosure provides an apparatus for determining a nonlinear characteristic, which is applicable to a communication system with adjustable parameters, such as a high-speed communication system with adjustable parameters. FIG. 2 is a schematic diagram of a structure of the apparatus. Referring to FIG. 2, the apparatus 200 includes a first determining unit 201, a correcting unit 202 and a second determining unit 203. In this embodiment, the first determining unit 201 is configured to determine a correction factor of a nonlinear item of a nonlinear model of a system to be measured according to an input and/or a parameter of the system to be measured, the correcting unit 202 is configured to correct the nonlinear item of the nonlinear model of the system to be measured by using the correction factor, and the second determining unit 203 is configured to obtain a nonlinear characteristic of the system to be measured according to the corrected nonlinear model. The nonlinear characteristic allows the input and/or the parameter of the system to be corrected to produce a corrected output.

In this embodiment, the input of the system to be measured refers to a test signal, which may be a noise-like signal. In order that an estimation result of the nonlinear characteristic is more accurate, different system inputs may be set, so as to measure signal power under different system inputs, hence estimate the nonlinear characteristic of the system to be measured under the inputs.

In this embodiment, the parameter of the system to be measured may be a corresponding parameter of a relatively large nonlinear characteristic. For example, taking that an amplifier is the system to be measured as an example, the parameter of the system to be measured may a gain of the amplifier. For a communication system with adjustable parameters, the nonlinear characteristic is different under different parameters.

In this embodiment, in order that the nonlinear model is applicable to different system inputs and/or parameters, the nonlinear item of the nonlinear model is corrected by using a correction factor, and the correction factor may be determined according to the input and/or parameter of the system to be measured.

Figure 3:
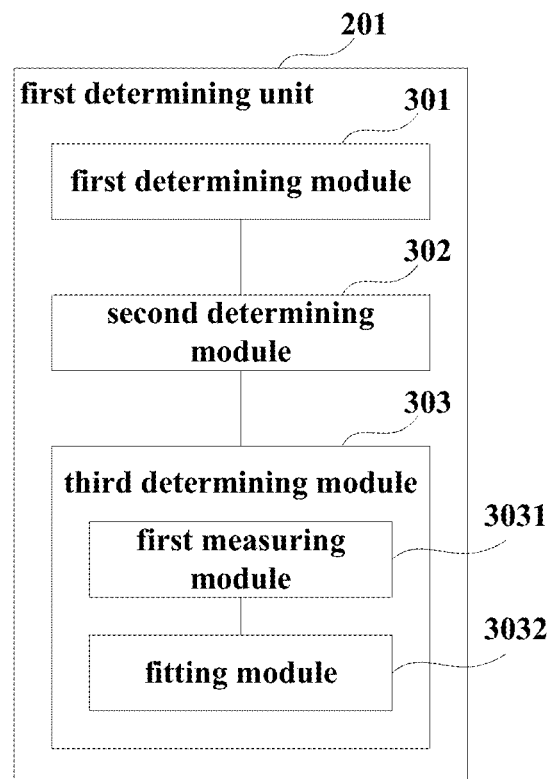
FIG. 3 is a schematic diagram of a structure of an implementation of a first determining unit of the apparatus in FIG. 2.

In an implementation, as shown in FIG. 3, the first determining unit 201 includes a first determining module 301 and a second determining module 302. The first determining module 301 determines signal power according to the input and/or the parameter of the system to be measured, and the second determining module 302 determines the above correction factor according to the signal power by using an empirical formula of a correction factor regarding signal power.

In this implementation, the signal power of the system to be measured may be determined according to its input and/or parameter, the signal power reflecting current input and/or parameter.

In this implementation, the empirical formula of the correction factor regarding the signal power may be predefined. For example, the empirical formula may be: the correction factor is equal to an exponential function of the signal power, that is, $\gamma=$; where, $\gamma$ is the correction factor, P is the signal power, and a is a parameter of the exponential function, which may be a constant, may be predefined, and may be obtained through advanced measurement.

In this implementation, the empirical formula of the correction factor regarding the signal power may be determined according to different inputs and/or parameters of the system to be measured. Then, in this implementation, as shown in FIG. 3, the first determining unit 201 may further include a third determining module 303 configured to determine the above empirical formula according to different inputs and/or parameters of the system to be measured.

As shown in FIG. 3, in an implementation of the third determining module 303, the third determining module may include: a first measuring module 3031 and a fitting module 3032. The first measuring module 3031 measures optimal correction factors and signal power under different inputs and/or parameters of the system to be measured according to a predefined correction factor optimization criterion, and the fitting module 3032 performs empirical fitting on the optimal correction factors and signal power under different inputs and/or parameters, so as to obtain the empirical formula of a correction factor regarding signal power.

In this implementation, the correction factor optimization criterion may be a principle that a nonlinear noise power error to which a test signal corresponds is a minimum. The test signal here refers to a system input, that is, for each time of input and/or parameter of the system, a principle that a nonlinear noise power error to which the input (a test signal) corresponds is minimum is followed, so as to find a corresponding optimal correction factor and signal power under the input and/or parameter.

In this implementation, the correction factor optimization criterion may also be a principle that a difference between bit error rates (BER/Q factors) of a model and an experiment is minimum, that is, for each time of input and/or parameter of the system, a principle that the difference between the bit error rates of the model and the experiment is minimum is followed, so as to find a corresponding optimal correction factor and signal power under the input and/or parameter.

The above two correction factor optimization criteria are examples only, and during implementation, optimal correction factor and signal power of the system to be measured under different inputs and/or parameters may be determined according to other optimization criteria, and this embodiment is not limited thereto.

In this implementation, after the optimal correction factor and signal power of the system to be measured under different inputs and/or parameters are obtained, empirical fitting may be performed on the optimal correction factor and signal power, so as to obtain the empirical formula of the correction factor regarding signal power. For example, exponential function fitting may be used, and other fitting methods may also be used.

In this implementation, after the first determining module 301 determines the signal power of the test signal under the input and/or the parameter, the second determining module 302 may determine the correction factor under current input and/or the parameter according to the signal power by using the empirical formula of the correction factor regarding signal power, hence correct the nonlinear item of the nonlinear model of the system to be measured by using the correction factor, thereby obtaining the nonlinear characteristic of the system to be measured under the input and/or the parameter.

Figure 4:
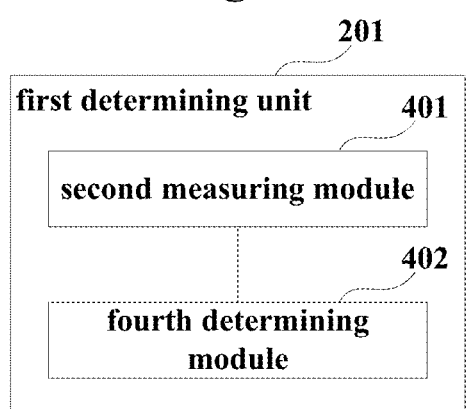
FIG. 4 is another schematic diagram of a structure of an implementation of a first determining unit of the apparatus in FIG. 2.

In another implementation, as shown in FIG. 4, the first determining unit 201 includes a second measuring module 401 and a fourth determining module 402. In this implementation, similar to the first measuring module 3031 shown in FIG. 3, the second measuring module 401 measures the optimal correction factors under different inputs and/or parameters of the system to be measured according to a predefined correction factor optimization criterion, so as to obtain a corresponding relationship between the different inputs and/or parameters and the optimal correction factors. In this implementation, the correction factor optimization criterion is as that described above, and shall not be described herein any further. In this implementation, the fourth determining module 402 determines the correction factor according to the input and/or parameter of the system to be measured and the corresponding relationship. In this implementation, empirical fitting is no longer performed on the optimal correction factors and signal power under different inputs and/or parameters, rather, the corresponding relationship between the different inputs and/or parameters and the optimal correction factors is used to determine the correction factor. In this implementation, the corresponding relationship may be carried out by a list, and may also be carried out by other means, such as a curve, and a function, etc. With such a corresponding relationship, the optimal correction factor to which the system to be measured corresponds may be determined based on its input and/or parameter, and the nonlinear item of the nonlinear model of the system to be measured is corrected by using the correction factor, thereby obtaining the nonlinear characteristic of the system to be measured under the input and/or the parameter.

In this embodiment, the correcting unit 202 may correct the nonlinear item of the nonlinear model of the system to be measured by multiplying the correction factor by the nonlinear item of the nonlinear model of the system to be measured. Hence, as the correction factor reflects different inputs and/or parameters of the system to be measured, even though an input and/or a parameter of the system to be measured is (are) changed, the nonlinear characteristic of the system to be measured may be estimated by using the corrected nonlinear model, thereby improving accuracy of the estimation and applicability, and solving the problem pointed out in the Background.

In this embodiment, according to a requirement on system complexity, the above nonlinear model may be a truncated Volterra model. For example, by setting orders of a truncated Volterra model and memory lengths to which the orders correspond, a truncated Volterra model is obtained and is taken as the above nonlinear model.

In this embodiment, the coefficient of the above nonlinear model may be obtained by measuring by using a conventional method, such as a least squares estimation method, and an adaptive iteration method, etc.

Figure 5A:
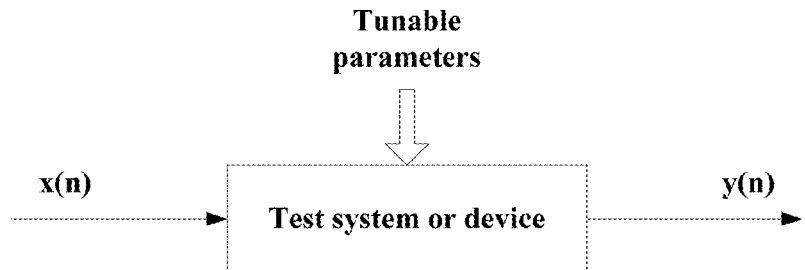
FIG. 5A is a schematic diagram of a system to be measured with adjustable parameters.
Figure 5B:
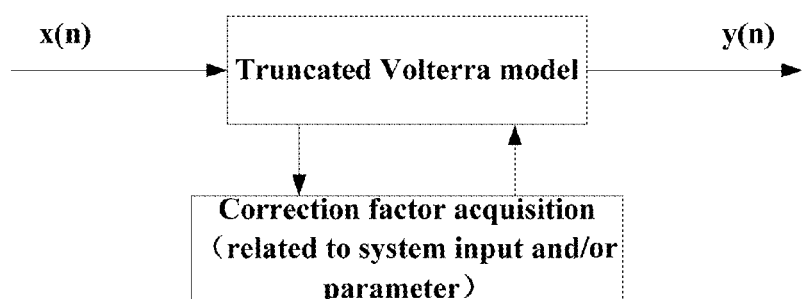
FIG. 5B is a schematic diagram of principles of a corrected Volterra model corresponding to the system to be measured in FIG. 5A.

FIG. 5A is a schematic diagram of a system to be measured with adjustable parameters, and FIG. 5B is a schematic diagram of a corrected Volterra model corresponding to the system to be measured in FIG. 5A. As shown in FIG. 5A, for the system to be measured, its parameters are adjustable, and its input x(n) may also be changed. By correcting the nonlinear item of the Volterra model by using the correction factor determined by the first determining unit 201 of the apparatus 200 of this embodiment, the corrected Volterra model is obtained. As shown in FIG. 5B, corresponding to the different inputs and/or parameters of the system to be measured, the nonlinear characteristic of the system to be measured may be estimated by using the corrected Volterra model.

For the principle and application of the apparatus 200 of this embodiment to be clearer, the operating principle of the apparatus 200 shall be described below taking that an amplifier is taken as the system to be measured as an example; wherein, the adjustable parameter is amplifier gain.

Figure 6A:
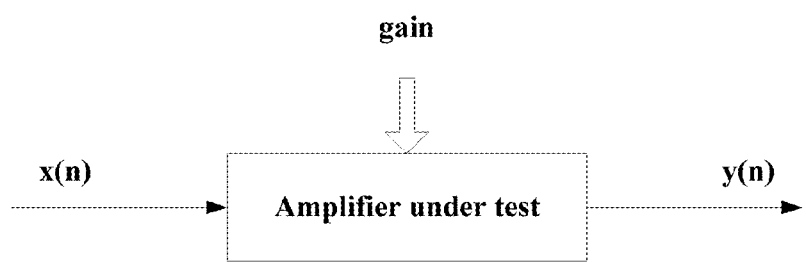
FIG. 6A is a schematic diagram of an amplifier taken as a system to be measured.
Figure 6B:
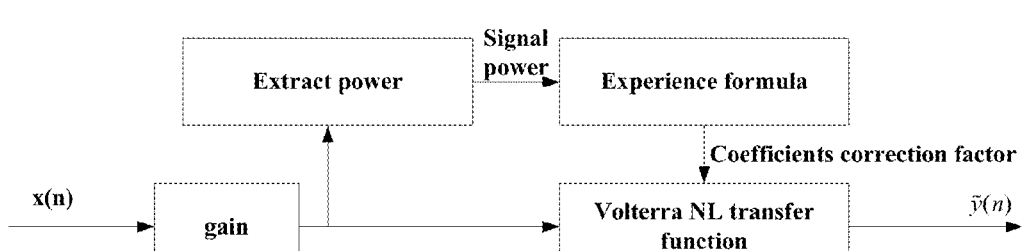
FIG. 6B is a schematic diagram of principles of a corrected Volterra model corresponding to the amplifier of FIG. 6A.

FIG. 6A is a schematic diagram of an amplifier taken as a system to be measured, and FIG. 6B is a schematic diagram of an operating principle of the corrected Volterra model corresponding to the amplifier in FIG. 6A.

In this example, as shown in FIG. 6B, Volterra orders and memory lengths used for amplifier modeling may be set first. For example, the highest order is a third order, the memory lengths are 101 samples for the first order, 11 samples for the second order, and 9 samples for the third order, respectively, and a corresponding total number of items and number of coefficients are 332. Then an input signal (a test signal) and a gain may be set. For example, the input signal is a noise-like signal, and the gain is a maximum gain. Hence, the model is modeled as the above-described Volterra model, and model coefficients are measured.

In this example, the optimal correction factor under the input and/or parameter may be found according to the correction factor optimization criterion, and then the signal power after the gain is measured. Thereafter, different inputs and/or parameters are changed, and the corresponding optimal correction factor and signal power are obtained by using the same method. For the optimal correction factor and signal power measured under different inputs and/or parameters, formula fitting may be performed, so as to obtain the empirical formula of the correction factor.

Taking exponential function fitting as an example, the obtained empirical formula of the correction factor is as follows:

$$\gamma = a1 \cdot \text{SnglPwr}^{a2};$$

where, $\gamma$ is the correction factor, SgnlPwr is the signal power, and a1 and a2 are fitting parameters.

The nonlinear item of the above-described Volterra model is corrected by using the correction factor, that is, the correction factor is multiplied by the nonlinear item of the Volterra model, so as to obtain the corrected Volterra model as follows:

$$y(n) = \sum_{k=-(N_1-1)/2}^{(N_1-1)/2} h_k^{(1)} x(n-k) + \gamma \cdot \left[ \sum_{k=-(N_2-1)/2}^{(N_2-1)/2} \sum_{l=-(N_2-1)/2}^{(N_2-1)/2} h_{k,l}^{(2)} x(n-k)x(n-l) + \sum_{k=-(N_3-1)/2}^{(N_3-1)/2} \sum_{l=-(N_3-1)/2}^{(N_3-1)/2} \sum_{m=-(N_3-1)/2}^{(N_3-1)/2} h_{k,l,m}^{(3)} x(n-k)x(n-l)x(n-m) + \ldots \right].$$

Hence, the nonlinear characteristic of the amplifier under the system input and/or parameter may be obtained, that is:

$$\gamma \cdot \left[ \sum_{k=-(N_2-1)/2}^{(N_2-1)/2} \sum_{l=-(N_2-1)/2}^{(N_2-1)/2} h_{k,l}^{(2)} x(n-k)x(n-l) + \sum_{k=-(N_3-1)/2}^{(N_3-1)/2} \sum_{l=-(N_3-1)/2}^{(N_3-1)/2} \sum_{m=-(N_3-1)/2}^{(N_3-1)/2} h_{k,l,m}^{(3)} x(n-k)x(n-l)x(n-m) + \ldots \right].$$

In this example, as the correction factor γ is related to the signal power and the signal power is different for different inputs and/or parameters, different correction factors γ may be obtained based on different system inputs and/or parameters. Hence, different nonlinear characteristics under different system inputs and/or parameters may be obtained.

In this example, considering that an amplifier gain is directly related to signal power (a nonlinear characteristic), for the amplifier, the corrected Volterra model needs to put the gain out of the nonlinear transfer function, as shown in FIG. 6.

What described above takes that the empirical formula of the correction factor is obtained by performing exponential function fitting on the optimal correction factor and signal power of the amplifier under different inputs and/or parameters by using the correction factor optimization criterion as an example; however, as described above, this embodiment is not limited thereto. The correction factor may also be determined by using a predetermined empirical formula related to the signal power, or the correction factor may also be determined according to a corresponding relationship between the optimal correction factor of the amplifier under different inputs and/or parameters and the different inputs and/or parameters.

Figure 7:
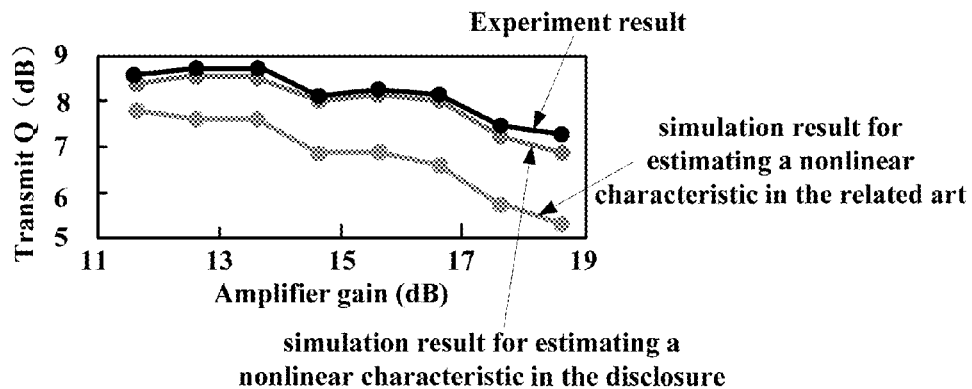
FIG. 7 is a schematic diagram of estimation of a nonlinear characteristic at different amplifier gains.

FIG. 7 is a schematic diagram of estimation of a nonlinear characteristic at different amplifier gains. In FIG. 7, a transmission signal is an NRZ (non-return to zero) 16QAM signal of a symbol rate of 32G. It can be seen from FIG. 7 that in comparison with an existing method, the method proposed in this application is more close to experiment values, and the accuracy of the estimation of the nonlinear characteristic is relatively high.

With the apparatus of the embodiment of the present disclosure, the nonlinear characteristic of the system to be measured under different inputs and/or parameters may be estimated, and accuracy of the estimation and applicability are improved.

Embodiment 2

An embodiment of the present disclosure provides a method for determining a nonlinear characteristic. As principles of the method are similar to that of the apparatus of Embodiment 1, the implementation of the apparatus of Embodiment 1 may be referred to for the implementation of the method, with identical contents being not going to be described herein any further.

Figure 8:
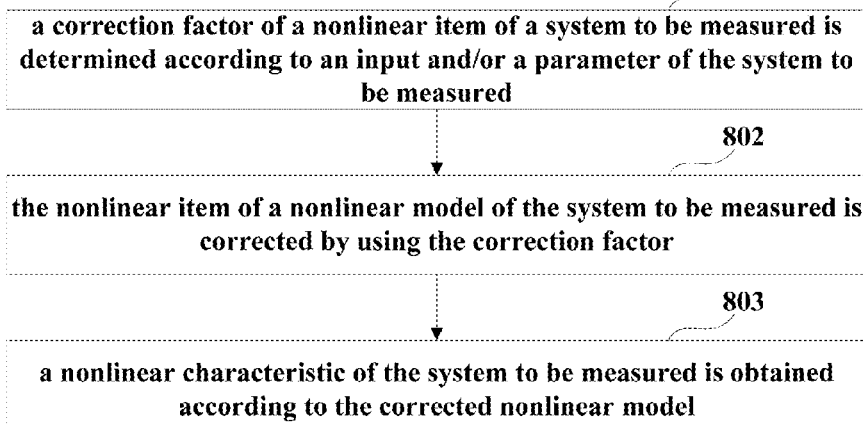
FIG. 8 is a flowchart of the method for determining a nonlinear characteristic of an embodiment of the present disclosure.

FIG. 8 is a flowchart of the method for determining a nonlinear characteristic of this embodiment. Referring to FIG. 8, the method includes:
step 801: a correction factor of a nonlinear item of a nonlinear model of a system to be measured is determined according to an input and/or a parameter of the system to be measured;
step 802: the nonlinear item of the nonlinear model of the system to be measured is corrected by using the correction factor; and
step 803: a nonlinear characteristic of the system to be measured is obtained according to the corrected nonlinear model.

The nonlinear characteristic allows the input and/or the parameter of the system to be corrected to produce a corrected output.

Figure 9:
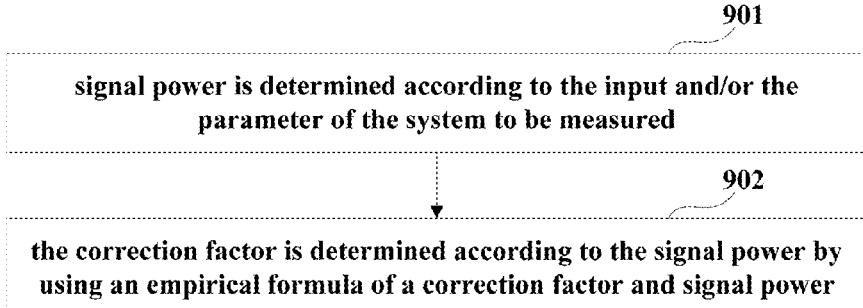
FIG. 9 is a flowchart of an implementation of step 801 of the method in FIG. 8.

FIG. 9 is a flowchart of an implementation of step 801. Referring to FIG. 9, in this implementation, step 801 includes:
step 901: signal power is determined according to the input and/or the parameter of the system to be measured; and
step 902: the correction factor is determined according to the signal power by using an empirical formula of a correction factor regarding signal power.

In an implementation, the empirical formula may be predefined. For example, the empirical formula may be: the correction factor is equal to an exponential function of the signal power. In this example, a parameter of the exponential function may be predefined, and may also be obtained through advanced measurement.

Figure 10:
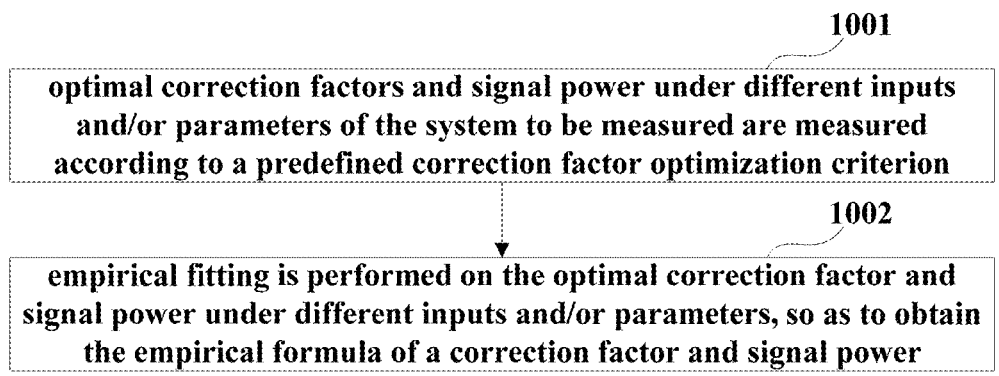
FIG. 10 is a flowchart of an implementation of determining an empirical formula of the method in FIG. 9.

In another implementation, the empirical formula may be determined according to different inputs and/or parameters of the system to be measured. For example, the empirical formula may be determined by using the method shown in FIG. 10. As shown in FIG. 10, the method includes:
step 1001: optimal correction factors and signal power under different inputs and/or parameters of the system to be measured are measured according to a predefined correction factor optimization criterion; and
step 1002: empirical fitting is performed on the optimal correction factors and signal power under different inputs and/or parameters, so as to obtain the empirical formula of a correction factor regarding signal power.

In this implementation, the optimization criterion is as described above, and description of which is omitted herein.

In this implementation, the empirical fitting is, for example, exponential function fitting; however, this embodiment is not limited thereto.

Figure 11:
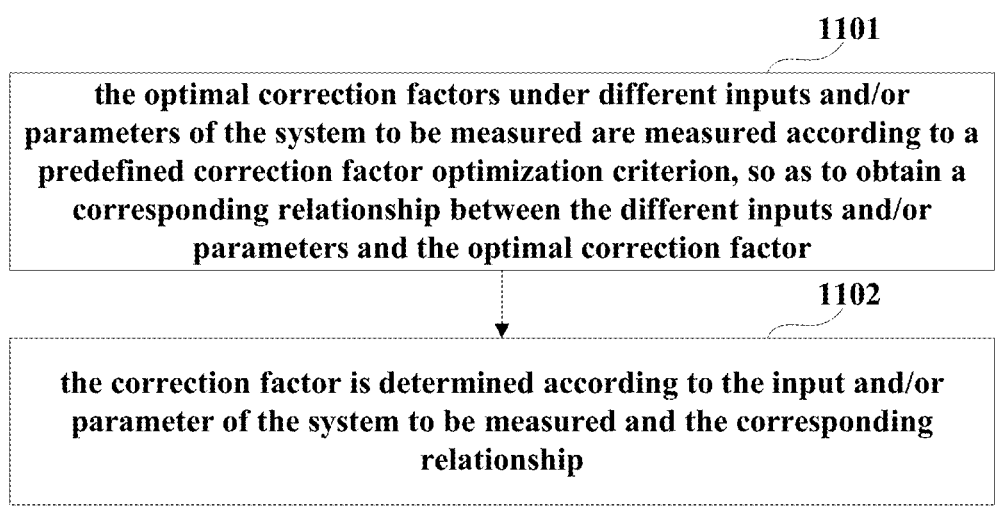
FIG. 11 is a flowchart of another implementation of step 801 of the method in FIG. 8.

FIG. 11 is a flowchart of another implementation of step 801. Referring to FIG. 11, in this implementation, step 801 includes:
step 1101: the optimal correction factors under different inputs and/or parameters of the system to be measured are measured according to a predefined correction factor optimization criterion, so as to obtain a corresponding relationship between the different inputs and/or parameters and the optimal correction factors; and
step 1102: the correction factor is determined according to the input and/or parameter of the system to be measured and the corresponding relationship.

In this implementation, the optimization criterion is as described above, and description of which is omitted herein.

In step 802 of this embodiment, the nonlinear item of the nonlinear model of the system to be measured may be corrected by multiplying the correction factor by the nonlinear item of the nonlinear model of the system to be measured.

With the method of the embodiment of the present disclosure, the nonlinear characteristic of the system to be measured under different inputs and/or parameters may be estimated, and accuracy of the estimation and applicability are improved.

Embodiment 3

An embodiment of the present disclosure provides a network entity. The network entity may be a transmitter or a receiver, may be a part of a transmitter or a receiver, such as an electrical amplifier, may be a part of a transmission network, such as a combination of several relay amplifiers, and may also be a communication system to be measured. The network entity may include the apparatus for determining a nonlinear characteristic as described in Embodiment 1.

Figure 12:
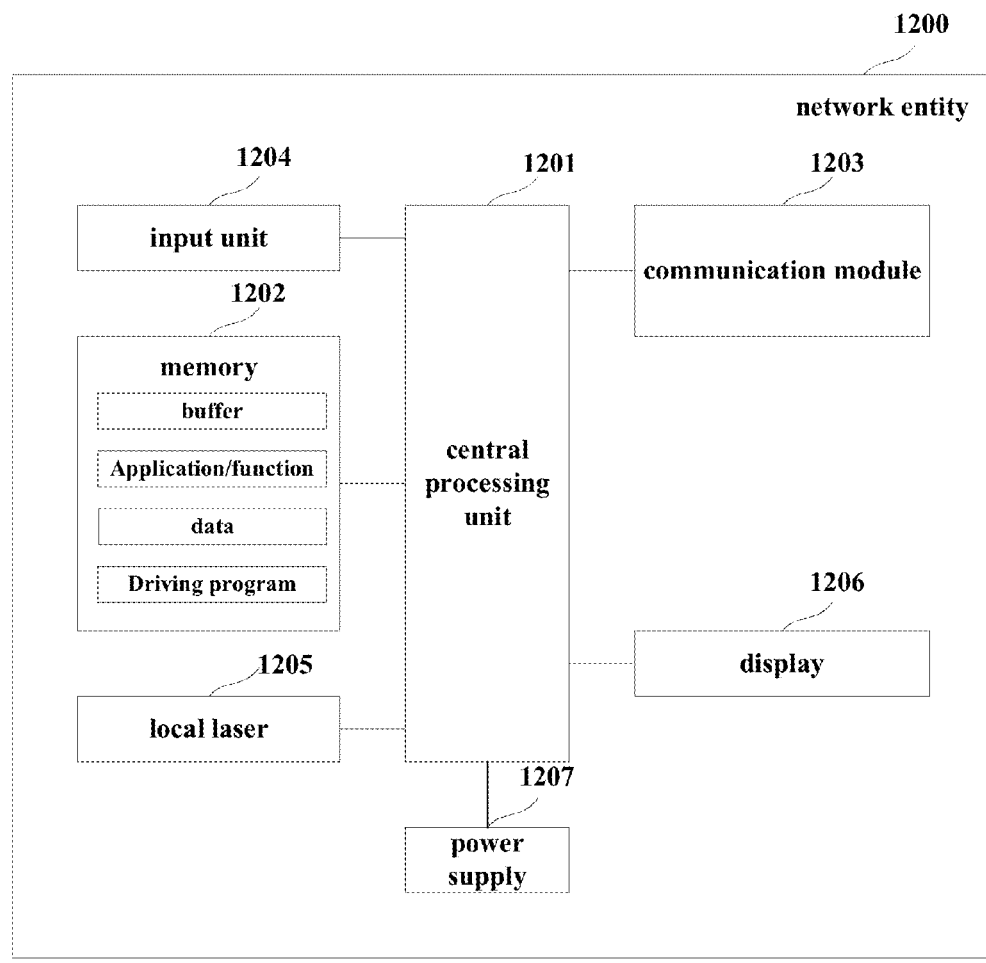
FIG. 12 is a schematic diagram of a hardware structure of the network entity of an embodiment of the present disclosure.

FIG. 12 is a schematic diagram of a structure of the network entity of this embodiment. As shown in FIG. 12, the network entity 1200 may include a central processing unit (CPU) 1201 and a memory 1202, the memory 1202 being coupled to the central processing unit 1201. It should be noted that this figure is illustrative only, and other types of structures may also be used, so as to supplement or replace this structure and achieve telecommunications function or other functions.

In an implementation, the functions of the apparatus for determining a nonlinear characteristic described in Embodiment 1 may be integrated into the central processing unit 1201.

In another implementation, the apparatus for determining a nonlinear characteristic and the central processing unit 1201 may be configured separately. For example, the apparatus for determining a nonlinear characteristic may be configured as a chip connected to the central processing unit 1201, with its functions being realized under control of the central processing unit 1201.

As shown in FIG. 12, the network entity 1200 may further include a communication module 1203, an input unit 1204, a local laser 1205, a display 1206 and a power supply 1207. It should be noted that the network entity 1200 does not necessarily include all the parts shown in FIG. 12. And furthermore, the network entity 1200 may include components not shown in FIG. 12, and the related art may be referred to.

As shown in FIG. 12, the central processing unit 1201 is sometimes referred to as a controller or control, and may include a microprocessor or other processor devices and/or logic devices. The central processing unit 1201 receives input and controls operations of every components of the network entity 1200.

In this embodiment, the memory 1202 may be, for example, one or more of a buffer memory, a flash memory, a hard drive, a mobile medium, a volatile memory, a nonvolatile memory, or other suitable devices. It may store information on a failure, and may further store programs executing related information. And the central processing unit 1201 may execute the programs stored in the memory 1202, so as to realize information storage or processing, etc. Functions of other parts are similar to those of the related art, which shall not be described herein any further. The parts of the network entity 1200 may be realized by specific hardware, firmware, software, or any combination thereof, without departing from the scope of the present disclosure.

The network entity of the embodiment of the present disclosure may estimate the nonlinear characteristic of the system to be measured under different inputs and/or parameters, thereby improving accuracy of the estimation and applicability.

Embodiment 4

Figure 13:
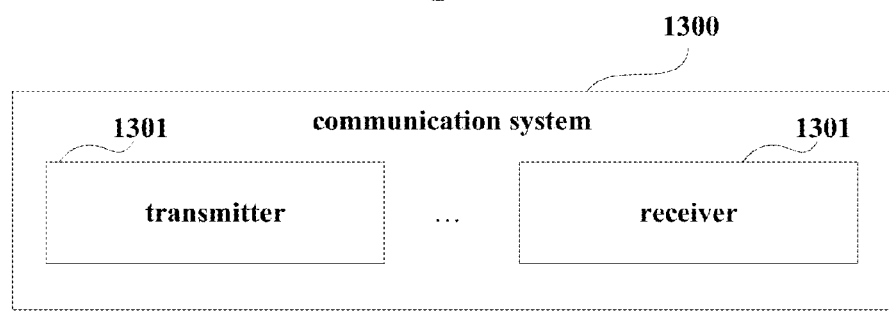
FIG. 13 is a topology of the communication system of an embodiment of the present disclosure.

An embodiment of the present disclosure provides a communication system. FIG. 13 is a schematic diagram of a structure of the communication system. As shown in FIG. 13, the system 1300 includes multiple network entities 1301. As described above, the network entity 1301 may be a transmitter or a receiver, may be a part of a transmitter or a receiver, such as an electrical amplifier, may be a part of a transmission network, such as a combination of several relay amplifiers, and may also be a communication system to be measured, etc. In this embodiment, the network entity 1301 may be carried out by the network entity described in Embodiment 3, the contents of which being incorporated herein, and being not going to be described herein any further.

With the communication system of the embodiment of the present disclosure, the network entity may estimate the nonlinear characteristic of the system to be measured under different inputs and/or parameters, thereby improving accuracy of the estimation and applicability.

An embodiment of the present disclosure further provides a computer-readable program, wherein when the program is executed in a network entity, the program enables the network entity to carry out the method as described in Embodiment 2.

An embodiment of the present disclosure further provides a storage medium in which a computer-readable program is stored, wherein the computer-readable program enables the network entity to carry out the method as described in Embodiment 2.

The above apparatuses and methods of the present disclosure may be implemented by hardware, such as a logic circuit, or by hardware, such as a computer, in combination with software. The present disclosure relates to such a computer-readable program that when the program is executed by a logic device, the logic device is enabled to carry out the apparatus or components as described above, or to carry out the methods or steps as described above. The present disclosure also relates to a computer readable non-transitory storage medium for storing the above program, such as a hard disk, a floppy disk, a CD, a DVD, and a flash memory, etc.

The present disclosure is described above with reference to particular embodiments. However, it should be understood by those skilled in the art that such a description is illustrative only, and not intended to limit the protection scope of the present disclosure. Various variants and modifications may be made by those skilled in the art according to the principle of the present disclosure, and such variants and modifications fall within the scope of the present disclosure.

For the implementation containing the above embodiments, following supplements are further disclosed.

Supplement 1. A method for determining a nonlinear characteristic, comprising:
determining a correction factor of a nonlinear item of a nonlinear model of a system to be measured according to an input and/or a parameter of the system to be measured;
correcting the nonlinear item of the nonlinear model of the system to be measured by using the correction factor; and
obtaining a nonlinear characteristic of the system to be measured according to the corrected nonlinear model.

Supplement 2. The method according to supplement 1, wherein the determining a correction factor of a nonlinear item of a system to be measured includes:
determining signal power according to the input and/or the parameter of the system to be measured; and
determining the correction factor according to the signal power by using an empirical formula of a correction factor regarding signal power.

Supplement 3. The method according to supplement 2, wherein the empirical formula is predefined.

Supplement 4. The method according to supplement 3, wherein the empirical formula is: the correction factor is equal to an exponential function of the signal power.

Supplement 5. The method according to supplement 4, wherein a parameter of the exponential function is predefined or is obtained through advanced measurement.

Supplement 6. The method according to supplement 2, wherein the empirical formula is determined according to different inputs and/or parameters of the system to be measured.

Supplement 7. The method according to supplement 6, wherein the determining the empirical formula according to different inputs and/or parameters of the system to be measured includes:

measuring optimal correction factors and signal power under different inputs and/or parameters of the system to be measured according to a predefined correction factor optimization criterion; and performing empirical fitting on the optimal correction factors and signal power under different inputs and/or parameters, so as to obtain the empirical formula of a correction factor regarding signal power.

Supplement 8. The method according to supplement 1, wherein the determining a correction factor of a nonlinear item of a system to be measured includes:

measuring the optimal correction factors under different inputs and/or parameters of the system to be measured according to a predefined correction factor optimization criterion, so as to obtain a corresponding relationship between the different inputs and/or parameters and the optimal correction factors; and determining the correction factor according to the input and/or parameter of the system to be measured and the corresponding relationship.

Supplement 9. The method according to supplement 1, wherein the correcting the nonlinear item of a nonlinear model of the system to be measured by using the correction factor includes:

multiplying the correction factor by a nonlinear item of the nonlinear model of the system to be measured.

Supplement 10. An apparatus for determining a nonlinear characteristic, including:

a first determining unit configured to determine a correction factor of a nonlinear item of a nonlinear model of a system to be measured according to an input and/or a parameter of the system to be measured;

a correcting unit configured to correct the nonlinear item of the nonlinear model of the system to be measured by using the correction factor; and a second determining unit configured to obtain a nonlinear characteristic of the system to be measured according to the corrected nonlinear model.

Supplement 11. The apparatus according to supplement 10, wherein the first determining unit includes:

a first determining module configured to determine signal power according to the input and/or the parameter of the system to be measured; and a second determining module configured to determine the correction factor according to the signal power by using an empirical formula of a correction factor regarding signal power.

Supplement 12. The apparatus according to supplement 11, wherein the empirical formula is predefined.

Supplement 13. The apparatus according to supplement 12, wherein the empirical formula is: the correction factor is equal to an exponential function of the signal power.

Supplement 14. The apparatus according to supplement 13, wherein a parameter of the exponential function is predefined or is obtained through advanced measurement.

Supplement 15. The apparatus according to supplement 11, wherein the empirical formula is determined according to different inputs and/or parameters of the system to be measured.

Supplement 16. The apparatus according to supplement 15, wherein the first determining unit further includes a third determining module configured to determine the empirical formula according to different inputs and/or parameters of the system to be measured, the third determining module including:

a first measuring module configured to measure optimal correction factors and signal power under different inputs and/or parameters of the system to be measured according to a predefined correction factor optimization criterion; and a fitting module configured to perform empirical fitting on the optimal correction factors and signal power under different inputs and/or parameters, so as to obtain the empirical formula of a correction factor regarding signal power.

Supplement 17. The apparatus according to supplement 16, wherein the correction factor optimization criterion is: a principle that a nonlinear noise power error to which a test signal corresponds is minimum, or a principle that a difference between bit error rates of a model and an experiment is minimum.

Supplement 18. The apparatus according to supplement 10, wherein the first determining unit includes:

a second measuring module configured to measure the optimal correction factors under different inputs and/or parameters of the system to be measured according to a predefined correction factor optimization criterion, so as to obtain a corresponding relationship between the different inputs and/or parameters and the optimal correction factors; and a fourth determining module configured to determine the correction factor according to the input and/or parameter of the system to be measured and the corresponding relationship.

Supplement 19. The apparatus according to supplement 18, wherein the correction factor optimization criterion is: a principle that a nonlinear noise power error to which a test signal corresponds is minimum, or a principle that a difference between bit error rates of a model and an experiment is minimum.

Supplement 20. The apparatus according to supplement 10, wherein the correcting unit corrects the nonlinear item of the nonlinear model of the system to be measured by multiplying the correction factor by a nonlinear item of the nonlinear model of the system to be measured.

Although a few embodiments have been shown and described, it would be appreciated by those skilled in the art that changes may be made in these embodiments without departing from the principles and spirit of the embodiments, the scope of which is defined in the claims and their equivalents.

What is claimed is:

1. An apparatus for determining a nonlinear characteristic, comprising:

a memory that stores a plurality of instructions;

a processor coupled to the memory and configured to execute the instructions to;

determine a correction factor of a nonlinear item of a nonlinear model of a system to be measured with adjustable parameters according to an input and/or a parameter of the system to be measured;

correct the nonlinear item of the nonlinear model of the system to be measured by using the correction factor; and a nonlinear characteristic of the system to be measured according to the corrected nonlinear model;

wherein the determining a correction factor of a nonlinear item of a system to be measured comprises:

determining signal power according to the input and/or the parameter of the system to be measured; and determining the correction factor according to the signal power by using an empirical formula of a signal power correction factor regarding signal power.

2. The apparatus according to claim 1, wherein the empirical formula is predefined.

3. The apparatus according to claim 2, wherein the empirical formula comprises: the correction factor is equal to an exponential function of the signal power.

4. The apparatus according to claim 3, wherein a function parameter of the exponential function is one of predefined and is obtained through advanced measurement.

5. The apparatus according to claim 1, wherein the empirical formula is determined according to different inputs and/or parameters of the system to be measured.

6. The apparatus according to claim 5, wherein:
the processor is further configured to determine the empirical formula according to different inputs and/or parameters of the system to be measured,
wherein the determining the empirical formula according to different inputs and/or parameters of the system to be measured comprises:
measuring optimal correction factors and
signal power under different inputs and/or parameters of the system to be measured according to a predefined correction factor optimization criterion; and
performing empirical fitting on the optimal correction factors and signal power under different inputs and/or parameters as to obtain the empirical formula of the signal power correction factor regarding signal power.

7. The apparatus according to claim 6, wherein the correction factor optimization criterion comprises one of: a first principle that a nonlinear noise power error to which a test signal corresponds is minimum, and a second principle that a difference between bit error rates of a model and an experiment is minimum.

8. The apparatus according to claim 1, wherein the determining a correction factor of a nonlinear item of a system to be measured comprises:
measuring optimal correction factors under different inputs and/or parameters of the system to be measured according to a predefined correction factor optimization criterion to obtain a corresponding relationship between the different inputs and/or parameters and the optimal correction factors; and
determining the correction factor according to the input and/or parameter of the system to be measured and the corresponding relationship.

9. The apparatus according to claim 8, wherein the correction factor optimization criterion comprises one of: a first principle that a nonlinear noise power error to which a test signal corresponds is minimum, and a second principle that a difference between bit error rates of a model and an experiment is minimum.

10. The apparatus according to claim 1, wherein the correcting the nonlinear item of a nonlinear model of the system to be measured by using the correction factor comprises multiplying the correction factor by the nonlinear item of the nonlinear model of the system to be measured.

11. A method for determining a nonlinear characteristic, comprising:
determining a correction factor of a nonlinear item of a nonlinear model of a system to be measured with adjustable parameters according to an input and/or a parameter of the system to be measured;
correcting the nonlinear item of the nonlinear model of the system to be measured by using the correction factor; and obtaining a nonlinear characteristic of the system to be measured according to the corrected nonlinear model;
wherein the determining a correction factor of a nonlinear item of a system to be measured comprises:
determining signal power according to the input and/or the parameter of the system to be measured; and
determining the correction factor according to the signal power by using an empirical formula of a signal power correction factor regarding signal power.

12. The method according to claim 11, wherein the empirical formula is predefined.

13. The method according to claim 12, wherein the empirical formula comprises: the correction factor is equal to an exponential function of the signal power.

14. The method according to claim 13, wherein a parameter of the exponential function is one of predefined and is obtained through advanced measurement.

15. The method according to claim 11, wherein the empirical formula is determined according to different inputs and/or parameters of the system to be measured.

16. The method according to claim 15, wherein the determining the empirical formula according to different inputs and/or parameters of the system to be measured comprises:
measuring optimal correction factors and signal power under different inputs and/or parameters of the system to be measured according to a predefined correction factor optimization criterion; and
performing empirical fitting on the optimal correction factors and signal power under different inputs and/or parameters to obtain the empirical formula of the signal power correction factor regarding signal power.

17. The method according to claim 11, wherein the determining a correction factor of a nonlinear item of a system to be measured comprises:
measuring the optimal correction factors under different inputs and/or parameters of the system to be measured according to a predefined correction factor optimization criterion to obtain a corresponding relationship between the different inputs and/or parameters and the optimal correction factors; and
determining the correction factor according to the input and/or parameter of the system to be measured and the corresponding relationship.

18. The method according to claim 11, wherein the correcting the nonlinear item of a nonlinear model of the system to be measured by using the correction factor comprises:
multiplying the correction factor by a nonlinear item of the nonlinear model of the system to be measured.

19. A non-transitory computer readable medium storing a method for determining a nonlinear characteristic, the method comprising:
determining a correction factor of a nonlinear item of a nonlinear model of a system to be measured with adjustable parameters according to an input and/or a parameter of the system to be measured;
correcting the nonlinear item of the nonlinear model of the system to be measured by using the correction factor;
obtaining a nonlinear characteristic of the system to be measured according to the corrected nonlinear model; and
correcting the system using the nonlinear characteristic to allow the input and/or the parameter of the system to produce a corrected output, wherein the determining a correction factor of a nonlinear item of a system to be measured comprises:
  determining signal power according to the input and/or the parameter of the system to be measured; and
  determining the correction factor according to the signal power by using an empirical formula of a signal power correction factor regarding signal power.

20. A system, comprising:
  a network entity comprising one of a transmitter, a receiver, a combination of several relay amplifiers, and a communication system to be measured with adjustable parameters;
  a computer:
    to determine a correction factor of a nonlinear item of a nonlinear model of a system to be measured according to an input and/or a parameter of the system to be measured;
    to correct the nonlinear item of the nonlinear model of the system to be measured by using the correction factor; and
    to obtain a nonlinear characteristic of the system to be measured according to the corrected nonlinear model;
    to correct the system using the nonlinear characteristic to allow the input and/or the parameter of the system to produce a corrected output;
  wherein the determining a correction factor of a nonlinear item of a system to be measured comprises:
    determining signal power according to the input and/or the parameter of the system to be measured; and
    determining the correction factor according to the signal power by using an empirical formula of a signal power correction factor regarding signal power.

* * * * *